(12) United States Patent
Yang

(10) Patent No.: US 9,362,199 B2
(45) Date of Patent: *Jun. 7, 2016

(54) CHIP THERMAL DISSIPATION STRUCTURE

(71) Applicant: Princo Middle East FZE, Dubai (AE)

(72) Inventor: Chih-kuang Yang, Hsinchu (TW)

(73) Assignee: PRINCO MIDDLE EAST FZE, Dubai (AE)

( * ) Notice: Subject to any disclaimer, the term of this patent is extended or adjusted under 35 U.S.C. 154(b) by 0 days.

This patent is subject to a terminal disclaimer.

(21) Appl. No.: 14/698,406

(22) Filed: Apr. 28, 2015

(65) Prior Publication Data

US 2015/0243577 A1    Aug. 27, 2015

Related U.S. Application Data

(62) Division of application No. 14/082,851, filed on Nov. 18, 2013, now Pat. No. 9,117,792.

(30) Foreign Application Priority Data

Dec. 17, 2012    (TW) .............................. 101147925 A

(51) Int. Cl.
| | | |
|---|---|---|
| *H01L 23/10* | (2006.01) | |
| *H01L 23/24* | (2006.01) | |
| *H01L 23/367* | (2006.01) | |
| *H01L 23/36* | (2006.01) | |

(Continued)

(52) U.S. Cl.
CPC ........ *H01L 23/3675* (2013.01); *H01L 23/3107* (2013.01); *H01L 23/36* (2013.01); *H01L 24/17* (2013.01); *H01L 25/0655* (2013.01); *H01L 2224/16* (2013.01); *H01L 2224/16225* (2013.01); *H01L 2224/16227* (2013.01); *H01L 2224/73204* (2013.01); *H01L 2924/15311* (2013.01); *H01L 2924/2064* (2013.01)

(58) Field of Classification Search
CPC . H01L 23/36; H01L 23/3675; H01L 23/3107; H01L 24/17
USPC .......................... 257/707, 713, 723, E23.101
See application file for complete search history.

(56) References Cited

U.S. PATENT DOCUMENTS

| | | |
|---|---|---|
| 5,276,586 A | 1/1994 | Hatsuda et al. |
| 5,444,296 A | 8/1995 | Kaul et al. |

(Continued)

FOREIGN PATENT DOCUMENTS

| | | |
|---|---|---|
| JP | 07-058269 | 3/1995 |
| JP | 9-55459 A | 2/1997 |

(Continued)

*Primary Examiner* — Nitin Parekh
(74) *Attorney, Agent, or Firm* — Hauptman Ham, LLP

(57) ABSTRACT

Disclosed is a chip thermal dissipation structure, employed in an electronic device comprising a first chip having a first chip face and a first chip back, comprising chip molding material, covering a lateral of the first chip; a first case, contacting the first chip back; a packaging substrate, connecting with the first chip face via first bumps; and a print circuit board, having a first surface and a second surface and connecting with the packaging substrate via solders. The chip thermal dissipation structure further comprises a second case, contacting the second surface. The thermal energy generated by the first chip is conducted toward the first case via the first chip back and toward the second case via the first chip face, the first bumps, the packaging substrate, the solders and the print circuit board.

8 Claims, 7 Drawing Sheets

(51) Int. Cl.
*H01L 23/31* (2006.01)
*H01L 23/00* (2006.01)
*H01L 25/065* (2006.01)

(56) References Cited

U.S. PATENT DOCUMENTS

| | | | |
|---|---|---|---|
| 5,909,056 A | 6/1999 | Mertol | |
| 5,923,084 A | 7/1999 | Inoue et al. | |
| 5,933,709 A | 8/1999 | Chun | |
| 5,976,912 A | 11/1999 | Fukutomi et al. | |
| 6,229,702 B1* | 5/2001 | Tao | H01L 23/3675 165/80.2 |
| 6,281,573 B1 | 8/2001 | Atwood et al. | |
| 6,442,033 B1 | 8/2002 | Liu et al. | |
| 6,462,410 B1 | 10/2002 | Novotny et al. | |
| 7,514,783 B2 | 4/2009 | Shimokawa et al. | |
| 2006/0044772 A1 | 3/2006 | Miura | |
| 2006/0055432 A1 | 3/2006 | Shimokawa et al. | |
| 2006/0103011 A1 | 5/2006 | Andry et al. | |
| 2006/0146503 A1* | 7/2006 | Kubo | H01L 23/04 361/720 |
| 2007/0257708 A1 | 11/2007 | Shimokawa et al. | |
| 2010/0014254 A1* | 1/2010 | Fukuzono | H01L 23/3675 361/719 |
| 2012/0267797 A1 | 10/2012 | Haba et al. | |
| 2014/0367844 A1* | 12/2014 | Hooper | H01L 23/36 257/712 |
| 2015/0035134 A1* | 2/2015 | Hung | H01L 23/3675 257/712 |
| 2015/0303127 A1* | 10/2015 | Michael | H01L 23/3114 257/712 |

FOREIGN PATENT DOCUMENTS

| | | |
|---|---|---|
| JP | 10-275883 | 10/1998 |
| JP | 11-74425 A | 3/1999 |
| JP | 2002-190549 | 7/2002 |
| JP | 2002-353388 | 12/2002 |
| JP | 2004-186294 | 7/2004 |
| JP | 2004-327556 | 11/2004 |
| JP | 2005-332918 | 12/2005 |
| JP | 2011-249398 A | 12/2011 |
| JP | 2012-109572 | 6/2012 |
| TW | 200903750 | 1/2009 |

* cited by examiner

CHIP THERMAL DISSIPATION STRUCTURE

CROSS-REFERENCE TO RELATED APPLICATION

This application is a Divisional Application of U.S. patent application Ser. No. 14/082,851, filed on Nov. 18, 2013, which claims priority from and the benefit under 35 U.S.C. §119(a) of Taiwanese Patent Application No. 101147925, filed on Dec. 17, 2012 in the TIPO (Taiwan Intellectual Property Office), which is hereby incorporated by reference for all purposes as if fully set forth herein.

BACKGROUND OF THE INVENTION

1. Field of the Invention

The present invention generally relates to a chip thermal dissipation structure, and more particularly to a chip thermal dissipation structure employed in an electronic device comprising one or more chips.

2. Description of Prior Art

The development of integrated circuit technology nowadays has become unprecedented and innovative. The size of the chips becomes smaller and smaller. The design of the electronic device, such as digital cameras, mobile phones, phablets and other various kinds of electronic devices continue to be microminiaturized. The amount of the integrated circuit components, such as chips utilized in those electronic devices is not merely few. In such highly competitive capital market, the efficiency electronic devices are doomed to be constantly raised for obtaining the advantages of product competitions. Therefore, the chips, the integrated circuit components, such as microprocessors, communication chips with various specifications, memories, audio/video processing chips and etc. The working frequencies are constantly competing to increase. As increasing the working frequencies for obtaining the advantages of product competitions, the designs of the electronic devices are required to be light, and thin, and small. However, the working frequencies of the chips and the integrated circuit components which are considered as heat sources are required to be raised. The amounts of the chips and the integrated circuit components are increasing and the heat densities inevitably increase. Consequently, the heat densities inside the electronic devices are constantly raised higher and higher.

However, for the aforesaid electronic devices, silence is essential requirement and feature. A general active heat dissipation means, such as a fan is impossibly suitable for the electronic devices which are required to be light, thin and small. The heat sink efficiency of a passive heat dissipation means cannot compete with the active heat dissipation means but demands for being light, thin and small can be realized thereby. The passive heat dissipation is definitely the chosen skill for the electronic devices which are required to be light and thin and small.

However, the challenge that the heat dissipation of the electronic devices faces becomes more and more severe.

Please refer to FIG. 1, which depicts a structure diagram of an electronic device having a chip A according to prior arts. As the arrangement shown in FIG. 1, a chip of a general electronic device is commonly located inside the electronic device. The structure of the electronic device comprises an upper shell 1, chip molding material 2, a plurality of bumps 3, a packaging substrate 4, a plurality of solders 5, a printed circuit board 6 and a lower shell 7. After the chip A is packaged by the packaging substrate 4 with the bumps 3, the chip molding material 2 is utilized for covering the chip A. The packaging substrate 4 connects with the printed circuit board 6 via solders 5. The printed circuit board 6 is fixed at the lower shell 7 with several fixing screws.

As shown in FIG. 1, a certain space between the chip molding material 2 and the upper shell 1 should be reserved; another certain space also should be reserved between the printed circuit board 6 and the lower shell 7. Sometimes, underfill material, such as epoxy is filled among the plurality of bumps 3. Because the thermal conductivity coefficient of the air is very low, therefore, the upward path of the heat flow thermal conductivity is stopped at the chip molding material 2 when the chip A generates heat. Many elements, such as the underfill material filled among the bumps 3 which has bad thermal conductivity, the dielectric layer material in the packaging substrate 4, the dielectric layer material in the print circuit board 6 and etc exist in the downward path of the heat flow thermal conductivity, the conductivity of the thermal energy generated by the Chip A is interfered thereby.

Accordingly, the heat density in unit volume must constantly accumulate with the working time of the chip A. Moreover, for realizing the light, thin and small requirements for the designs of the electronic devices, multiple chip integrated package has already become a main trend for now. When the chip A and other chips with lower temperatures are packaged in integration and the old heat dissipation design is utilized in the electronic devices, the heat flow path of the thermal energy generated by the chip A is inevitably conducted toward other chips (The thermal conductivity of the heat flow naturally tends toward the directions of lower thermal conductivity coefficient) and affect the other chips. Consequently, the structure temperature of the whole electronic device must be raised. The performance is affected. The power consumption is increased. Moreover, the lifetime of the electronic device is shortening even more.

SUMMARY OF THE INVENTION

An objective of the present invention is to provide a chip thermal dissipation structure, employed in an electronic device, comprising a first chip, having a first chip face and a first chip back; and an environmental which is outside the electronic device; chip molding material, covering a lateral of the first chip; a first case, contacting with both of the environment and the first chip back; a packaging substrate, connecting with the first chip face of the first chip via a plurality of first bumps; and a print circuit board, having a first surface and a second surface and connecting with the packaging substrate at the first surface via a plurality of solders.

The chip thermal dissipation structure of the present invention further comprises a second case, contacting the second surface of the print circuit board. The chip thermal dissipation structure of the present invention further comprises a second chip, having a second chip face and a second chip back, and the chip molding material covers a lateral of the second chip. The packaging substrate connects with the second chip face of the second chip via a plurality of second bumps. In one embodiment of the present invention, the chip molding material has a slit in between the first chip and second chip.

Furthermore, in another embodiment of the present invention, the first case comprises a downward protrusion in position corresponding to the first chip back of the first chip to contact the first chip back. The second case comprises an upward protrusion in position corresponding to the first chip to contact the second surface of the print circuit board. Selectively, the first case further contacts the second chip back of the second chip; the second case is further located below the print circuit board and the second chip. The second case contacts the second surface of the print circuit board in position corresponding to the second chip.

In another embodiment of the present invention, the first case maintains in contact with the first chip back of the first chip via a first heat-conducting material. The second case maintains in contact with the second surface of the print circuit board via a lower heat-conducting material.

According to the present invention, the thermal energy generated by the first chip is conducted toward the first case via the first chip back and toward the second case via the first chip face, the first bumps, the packaging substrate, the solder, the print circuit board.

The chip thermal dissipation structure of the present invention can significantly reduce the heat resistance from the first chip to the first case and the heat resistance from the first chip to the second case. The heat flow paths of thermal energy generated by the first chip are directly oriented toward the first case and the second case. In other words, a junction temperature at the first chip back of the first chip is lower than a junction temperature at the first chip back of the first chip under circumstance that the first case does not contact the first chip back; a junction temperature at the first chip face of the first chip is lower than a junction temperature of the first chip under circumstance that the second case does not contact the print circuit board in position corresponding to the first chip. Therefore, the thermal energy conducted toward the second chip in prior arts can be significantly reduced. Accordingly, the working temperature of the electronic device having one or more chips can be efficiently reduced. The working performance of the electronic device is promoted and the usage lifetime can be extended.

DETAILED DESCRIPTION OF THE INVENTION

Figure 2:
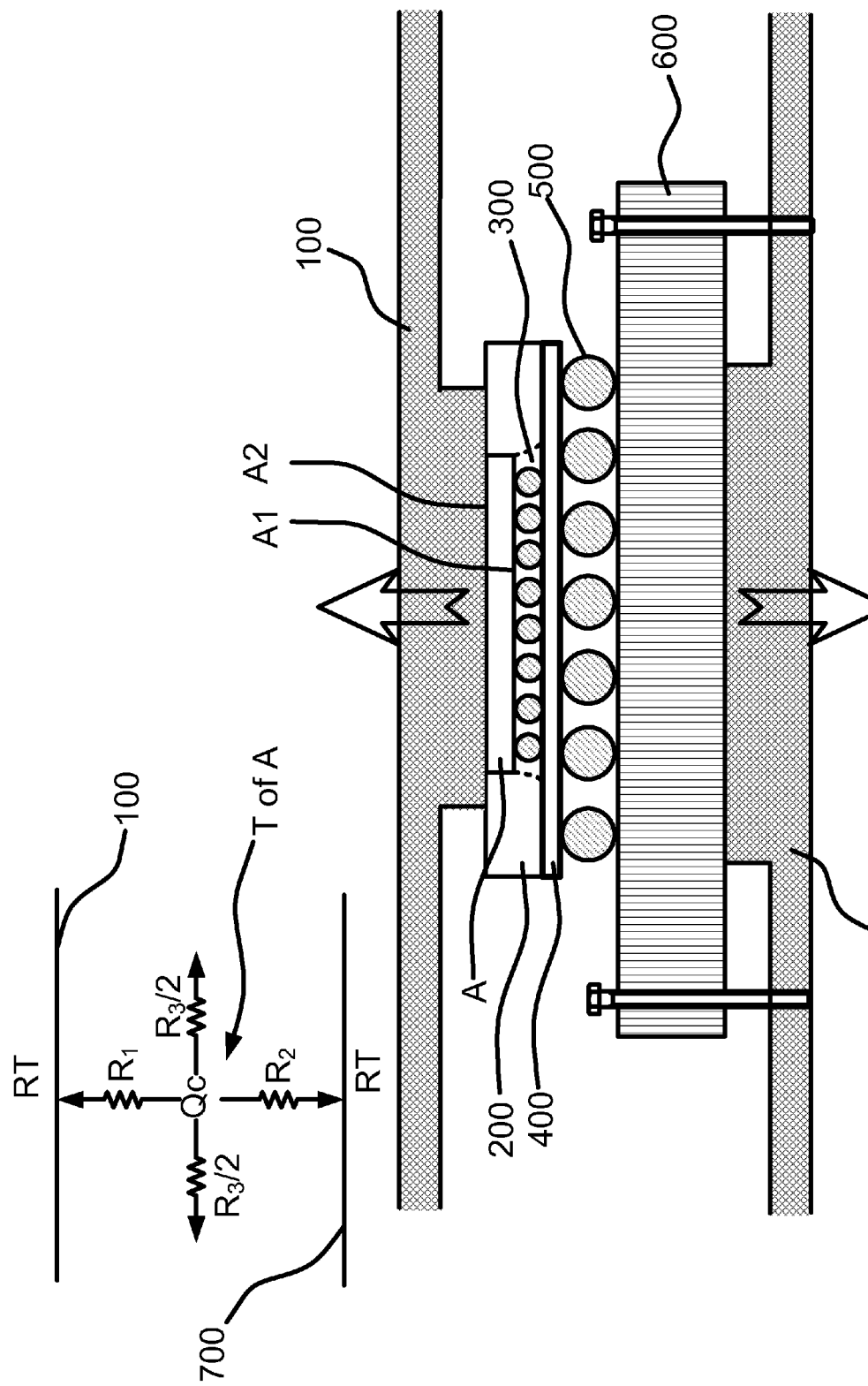
FIG. 2 depicts a assembly structure diagram of a chip thermal dissipation structure employed in an electronic device having a chip according to the first embodiment of the present invention.

Please refer to FIG. 2, which assembly structure diagram of a chip thermal dissipation structure employed in an electronic device having a first chip A according to the first embodiment of the present invention. The first Chip A has a first chip face A1 and a first chip back A2. The chip thermal dissipation structure of the present invention comprises a first case 100, chip molding material 200, a plurality of bumps 300, a packaging substrate 400, a plurality of solders 500, a printed circuit board 600 and a second case 700. The first chip A comprises semiconductive elements inside. The junction temperature of the semiconductive elements can be measured by an external circuit. Practically, the solder balls, the solder pastes and etc. can be illustrated as mentioning about the plurality of solders 500.

As shown in figure, the chip molding material 200 covers a lateral of the first chip A at least and optionally exposes the first chip back A2. Possibly, the chip molding material 200 can cover all or portion of the first chip back A2 of the first chip A with a thickness which is fairly thin, for example, only exposing the portion of the first chip back A2 which needs heat dissipation most can be illustrated. Practically, the chip molding material 200 also possesses a certain heat dissipation capability. The first case 100 is located above the first chip A and comprises a downward protrusion or an U-shape structure with an upward notch in position corresponding to the first chip back A2 of the first chip A to contact the first chip back A2 of the first chip A. The packaging substrate 400 comprises a plurality of dielectric layers (not shown). The thickness of each dielectric layer is less than 30 μm. The packaging substrate 400 connects with the first chip face A1 of the first chip A via the plurality of first bumps 300. As indicated by the dot lines shown in figure, the underfill material, such as epoxy can be filled among the plurality of first bumps 300. The printed circuit board 600 has an upward first surface and a downward second surface. The printed circuit board 600 connects the packaging substrate 400 at the first surface via a plurality of solders 500. The second case 700 is located below the print circuit board 600 and comprises an upward protrusion or a U-shape structure with a downward notch in position corresponding to the first chip A to contact the second surface of the printed circuit board 600. Possibly, the first case 100 and the second case 700 can be formed by metal material.

Because the thermal conductivity coefficient of the air is very low, it is about 0.0257 (W/mK) when the temperature is 20 degrees Celsius; about 0.0287 (W/mK) when the temperature is 60 degrees Celsius. However, the thermal conductivity coefficient of copper is about 386 (W/mK) when the temperature is 20 degrees Celsius; the thermal conductivity coefficient of aluminum is about 198 (W/mK) when the temperature is 20 degrees Celsius. The thermal conductivity coefficient of epoxy is about 0.19 (W/mK) when the temperature is 20 degrees Celsius. Even the epoxy type materials which have been improved with better thermal conductivities, the thermal conductivity coefficients thereof can merely reach up to 1-10 (W/mK). Therefore, according to the present invention, by employing the first case 100 or the second case 700 to contact the first chip back A2 or the print circuit board 600 in position corresponding to the first chip A, the heat resistance of the heat flow in these directions can be significantly reduced and multiple benefits can be acquired with manipulating the directions of the heat flow.

Please refer to FIG. 2 and the formulas of the thermal conduction phenomena related to the chip thermal dissipation structure of the present invention: T represents the junction temperature of the semiconductive element of the first chip A. $Q_C$ represents the total heat flow generated by the first chip A. $Q_1$ represents the heat flow toward the first case 100. $Q_2$ represents the heat flow toward the second case 700. $Q_3$ represents the heat flow toward the lateral direction.

$R_1$ represents the heat resistance toward the first case 100. $R_2$ represents the heat resistance toward the second case 700. $R_3$ represents the heat resistance toward the lateral direction.

The heat flow $Q_X$ toward the indicated direction is equal to the temperature difference $\Delta T$ between the temperature of the first chip A and the room temperature of the environment (RT) or equal to the temperature difference $\Delta T$ between the temperature of the first chip A and the temperature of one predetermined location toward the lateral direction divided by the heat resistance $R_X$ toward the indicated direction, i.e. $\Delta T/R_X$.

$$Q_1 = \Delta T/R_1;\ Q_2 = \Delta T/R_2;\ Q_3 = \Delta T/R_3.$$

Before the present invention is applied, the total heat flow should be equal to the sum of the heat flow toward all directions:

$$Q_C = Q_1 + Q_2 + Q_3 = \Delta T/R_1 + \Delta T/R_2 + \Delta T/R_3$$

$$\Delta T = Q_C/(1/R_1 + 1/R_2 + 1/R_3)$$

As the present invention is applied, at least the heat resistance toward the first case 100 is changed. Then, the heat flow $Q_X'$ toward the indicated direction is equal to the temperature difference $\Delta T'$ between the temperature of the first chip A and the room temperature of the environment (RT) or equal to the temperature difference $\Delta T'$ between the temperature of the first chip A and the temperature of one predetermined location toward the lateral direction divided by the heat resistance $R_X'$ toward the indicated direction, i.e. $\Delta T/R_X'$.

Accordingly, under circumstance that $Q_C$ is not changed, the heat flows toward the indicated directions as aforementioned are described below:

$$Q_1' = \Delta T'/R_1';\ Q_2' = \Delta T'/R_2;\ Q_3' = \Delta T'/R_3$$

$$Q_C = Q_1' + Q_2' + Q_3' = \Delta T'/R_1' + \Delta T'/R_2 + \Delta T'/R_3$$

$$\Delta T' = Q_C/(1/R_1' + 1/R_2 + 1/R_3)$$

According to the embodiment shown in FIG. 2, the heat resistance toward the first case 100, i.e. the heat resistance toward this specific direction is changed, i.e. $R_1 > R_1'$ and $R_2$, $R_3$ remain, then $Q_1 < Q_1'$; $\Delta T > \Delta T'$. In other words, according to the present invention, the heat resistance toward the first case 100 is changed, $R_1 > R_1'$. Furthermore, the heat resistance toward the second case 700 is also changed, $R_1 > R_2'$. Accordingly, the ratios of the heat flows $Q_1'$, $Q_2'$ and $Q_3'$ are manipulated. $Q_1'$ and $Q_2'$ can be enormously increased and relatively, $Q_3'$ can be enormously decreased.

Figure 1:
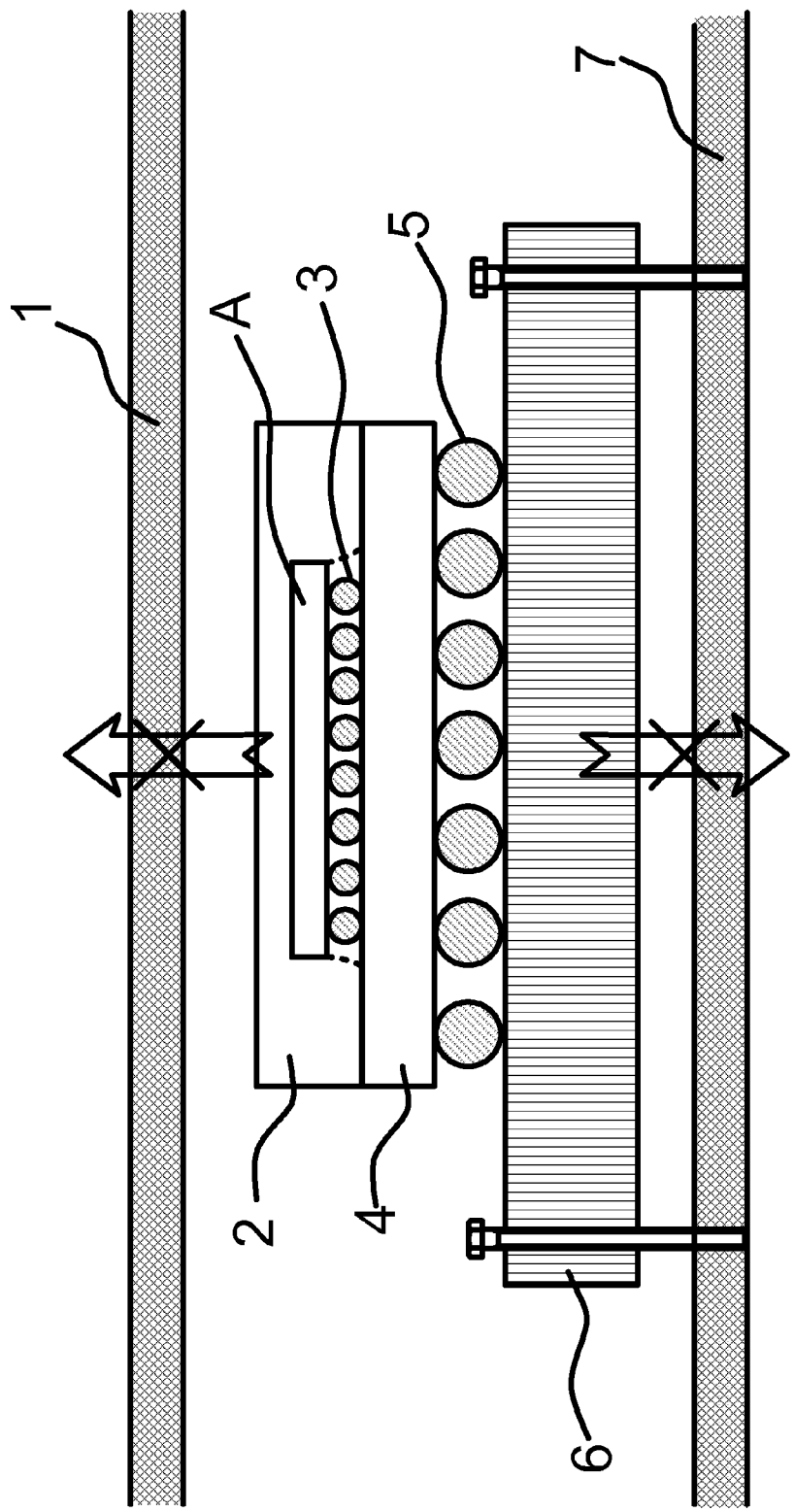
FIG. 1 depicts a structure diagram of an electronic device according to prior arts.

Therefore, as indicated by the arrows shown in figure, in comparison with FIG. 1, most of the thermal energy generated by the first chip A is conducted toward the first case 100 via the first chip back A2 and toward the second case 700 via the first chip face A1, the first bumps 300, the packaging substrate 400, the solders 500 and the print circuit board 600. Ultimately, a junction temperature of the first chip A is lower than a junction temperature of the first chip A under circumstance that the first case 100 does not contact the first chip back A2; a junction temperature of the first chip A is lower than a junction temperature of the first chip A under circumstance that the second case 700 does not contact the print circuit board 600 in position corresponding to the first chip A.

Figure 3:
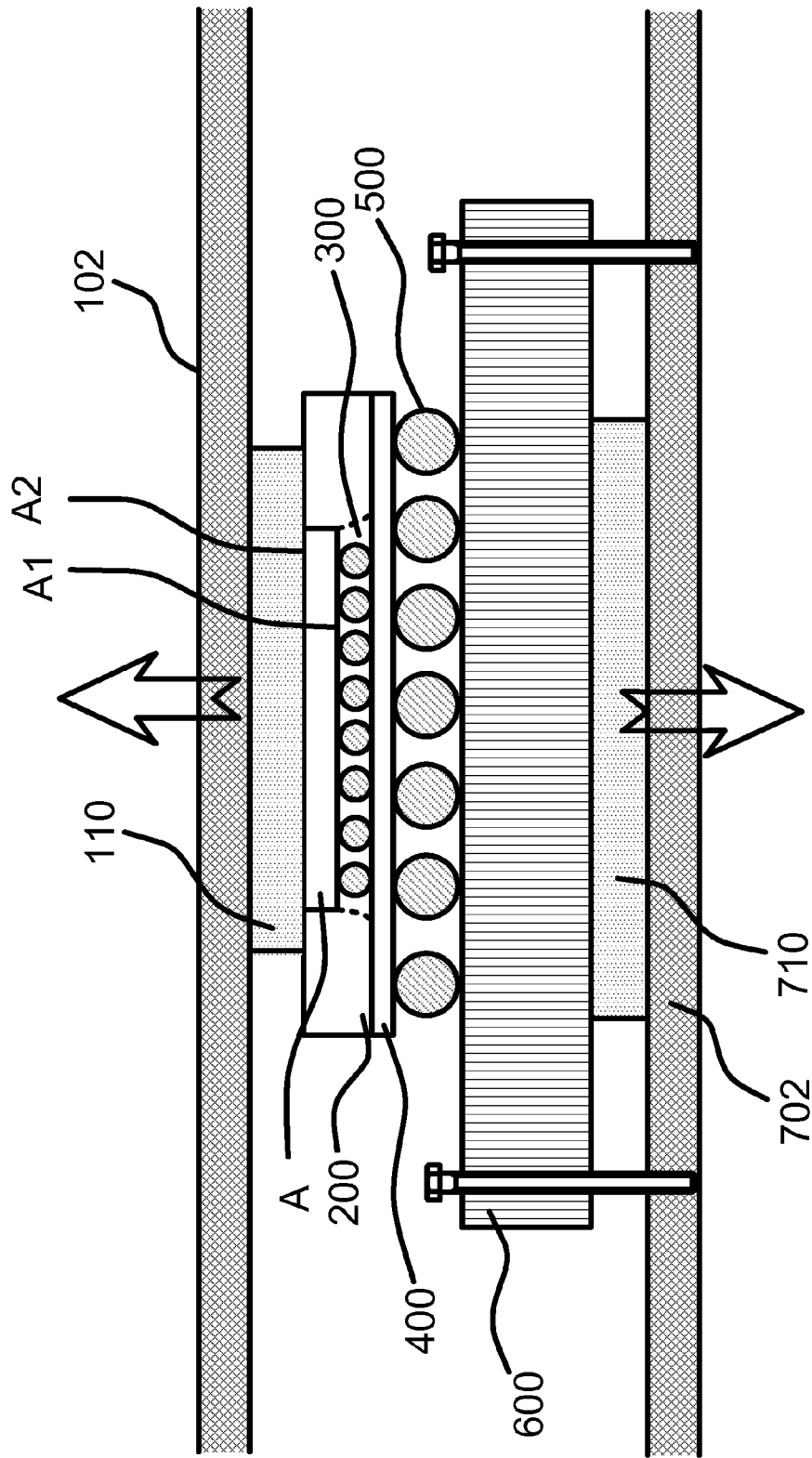
FIG. 3 depicts a assembly structure diagram of a chip thermal dissipation structure employed in an electronic device having a chip according to the second embodiment of the present invention.

Please refer to FIG. 3, which depicts a assembly structure diagram of a chip thermal dissipation structure employed in an electronic device having a chip A according to the second embodiment of the present invention. The first Chip A has a first chip face A1 and a first chip back A2. The chip thermal dissipation structure of the present invention comprises a first case 102, first heat-conducting material 110, chip molding material 200, a plurality of bumps 300, a packaging substrate 400, a plurality of solders 500, a printed circuit board 600, a second case 702 and second heat-conducting material 710. Practically, the solder balls, the solder pastes and etc. can be illustrated as mentioning about the plurality of solders 500.

As shown in figure, the chip molding material 200 covers a lateral of the first chip A at least and optionally exposes the first chip back A2. The first case 100 is located above the first chip A and maintains in contact with the first chip back A2 of the first chip A via a first heat-conducting material 110. The packaging substrate 400 comprises a plurality of dielectric layers (not shown). The thickness of each dielectric layer is less than 30 µm. The packaging substrate 400 connects with the first chip face A1 of the first chip A via the plurality of first bumps 300. As indicated by the dot lines shown in figure, the underfill material, such as epoxy can be filled among the plurality of first bumps 300. The printed circuit board 600 has an upward first surface and a downward second surface. The printed circuit board 600 connects the packaging substrate 400 at the first surface via a plurality of solders 500. The second case 700 is located below the print circuit board 600 and maintains in contact with the second surface of the print circuit board 600 via a second heat-conducting material 710. The first heat-conducting material 110 and the second heat-conducting material 710 can be organic materials doped with high thermal conductivity material powder, thermal dissipation components enhanced by liquid convection, or Peltier effect components.

Therefore, as indicated by the arrows shown in figure, the thermal energy generated by the first chip A is conducted toward the first case 100 via the first chip back A2, the first heat-conducting material 110 and toward the second case 700 via the first chip face A1, the first bumps 300, the packaging substrate 400, the solders 500, the print circuit board 600 and the second heat-conducting material 710. Ultimately, a junction temperature of the first chip A is lower than a junction temperature of the first chip A under circumstance that the first case 100 does not contact the first chip back A2; a junction temperature of the first chip A is lower than a junction temperature of the first chip A under circumstance that the second case 700 does not contact the print circuit board 600 in position corresponding to the first chip A.

Figure 4:
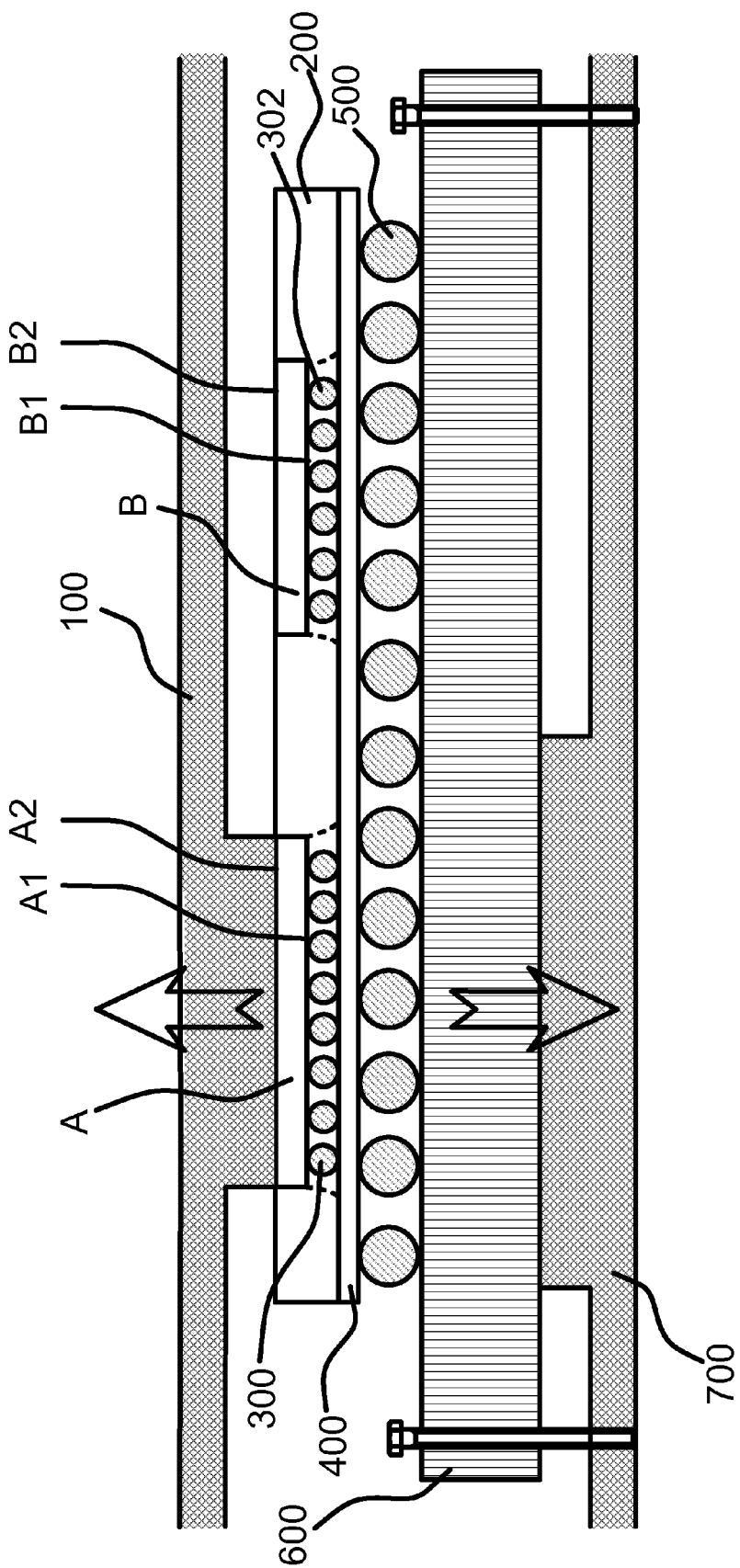
FIG. 4 depicts a assembly structure diagram of a chip thermal dissipation structure employed in an electronic device having more chips according to the third embodiment of the present invention.
Figure 5:
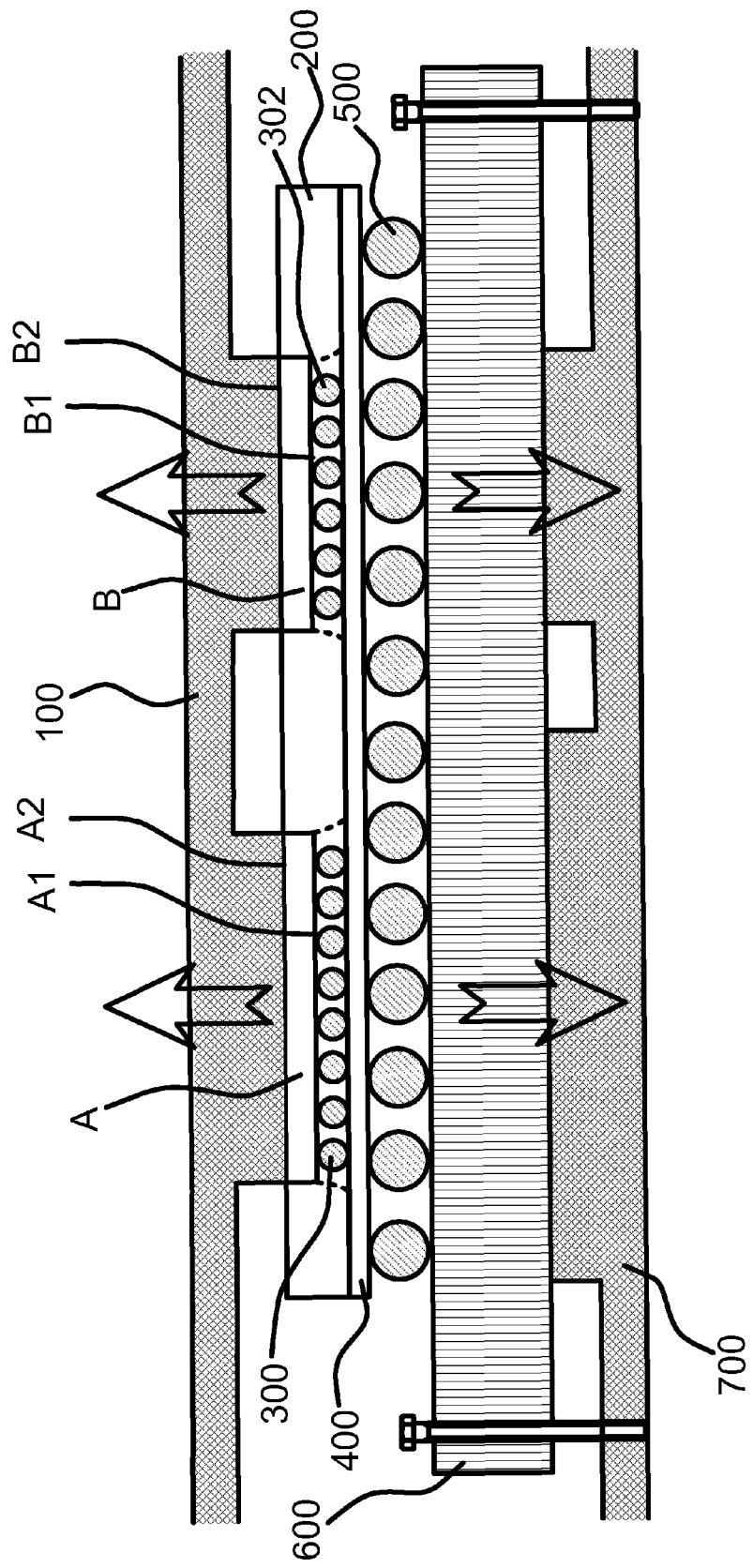
FIG. 5 depicts a assembly structure diagram of a chip thermal dissipation structure employed in an electronic device having more chips according to the fourth embodiment of the present invention.

Please refer to FIG. 4 and FIG. 5. FIG. 4 depicts a assembly structure diagram of a chip thermal dissipation structure employed in an electronic device having more chips A, B according to the third embodiment of the present invention. FIG. 5 depicts a assembly structure diagram of a chip thermal dissipation structure employed in an electronic device having more chips A, B according to the fourth embodiment of the present invention. The first Chip A has a first chip face A1 and a first chip back A2. The second Chip B has a second chip face B1 and a second chip back B2. The chip thermal dissipation structure of the present invention comprises a first case 100, chip molding material 200, a plurality of first bumps 300, a packaging substrate 400, a plurality of solders 500, a printed circuit board 600 and a second case 700.

As shown in FIG. 4, the chip molding material 200 covers a lateral of the first chip A at least and optionally exposes the first chip back A2. Meanwhile, the chip molding material 200 also covers a lateral of the second Chip B and optionally exposes the second chip back B2. Possibly, the chip molding material 200 can cover all or portion of the first chip back A2 of the first chip A and/or all or portion of the second chip back B2 of the second Chip B with a thickness which is fairly thin, for example, only exposing the portion of the first chip back A2 and/or the second chip back B2 which need heat dissipation most can be illustrated. The first case 100 is located above the first chip A and comprises a downward protrusion in position corresponding to the first chip back A2 of the first chip A to contact the first chip back A2 of the first chip A.

Certainly, in this embodiment, the first heat-conducting material 110 shown in FIG. 3 is also can be employed. The first case 100 in position corresponding to the second chip back B2 of the second Chip B maintains to be flat and does not contact the second Chip B. The packaging substrate 400 comprises a plurality of dielectric layers (not shown). The thickness of each dielectric layer is less than 30 μm. The packaging substrate 400 connects with the first chip face A1 of the first chip A via the plurality of first bumps 300 and connects with the second chip face B1 of the second Chip B via the plurality of second bumps 302.

As indicated by the dot lines shown in FIG. 4, the underfill material, such as epoxy can be filled among the plurality of first bumps 300 and the plurality of second bumps 302. The printed circuit board 600 has an upward first surface and a downward second surface. The printed circuit board 600 connects the packaging substrate 400 at the first surface via a plurality of solders 500. The second case 700 is located below the print circuit board 600 and comprises an upward protrusion in position corresponding to the first chip A to contact the second surface of the printed circuit board 600. Certainly, in this embodiment, the second heat-conducting material 710 shown in FIG. 3 is also can be employed. Then, the second case 700 in position corresponding to the second Chip B maintains to be flat and does not contact the printed circuit board 600.

Therefore, as indicated by the arrows shown in FIG. 4, the thermal energy generated by the first chip A is conducted toward the upper shell 100 via the first chip back A2 and toward the second case 700 via the first chip face A1, the first bumps 300, the packaging substrate 400, the solders 500 and the print circuit board 600. Ultimately, a junction temperature of the first chip A is lower than a junction temperature of the first chip A under circumstance that the first case 100 does not contact the first chip back A2; a junction temperature of the first chip A is lower than a junction temperature of the first chip A under circumstance that the second case 700 does not contact the print circuit board 600 in position corresponding to the first chip A. Meanwhile, a junction temperature of the second chip B is lower than a junction temperature of the second chip B under circumstance that the first case 100 does not contact the first chip back A2; a junction temperature of the second chip B is lower than a junction temperature of the second chip B under circumstance that the second case 700 does not contact the print circuit board 600 in position corresponding to the first chip A.

According to the present invention, the first case 100 or the second case 700 contacts the first chip back A2 or the print circuit board 600. The heat resistances of the heat flow paths can be significantly reduced. Accordingly, by manipulating the heat flow directions, most of the thermal energy generated by the first chip A is conducted toward the first case 100 via the first chip back A2 and toward the second case 700 via the first chip face A1, the first bumps 300, the packaging substrate 400, the solders 500 and the print circuit board 600. Significantly, the thermal energy conducted from the first chip A to the second chip B can be reduced to prevent the temperature of the second chip B to be raised by the thermal energy of the first chip A and results in the performance degradation of the second chip B.

In the fourth embodiment shown in FIG. 5, the difference from the third embodiment is: the first case 100 comprises a downward protrusion in position corresponding to the second chip back B2 of the second chip B to contact the second chip back B2 of the second chip B. The second case 700 comprises an upward protrusion in position corresponding to the second Chip B to contact the second surface of the printed circuit board 600. Significantly, the heat resistances of these directions are reduced. The heat flow paths of the thermal energy generated by the second Chip B are directly oriented toward the first case 100 and the second case 700.

Figure 6:
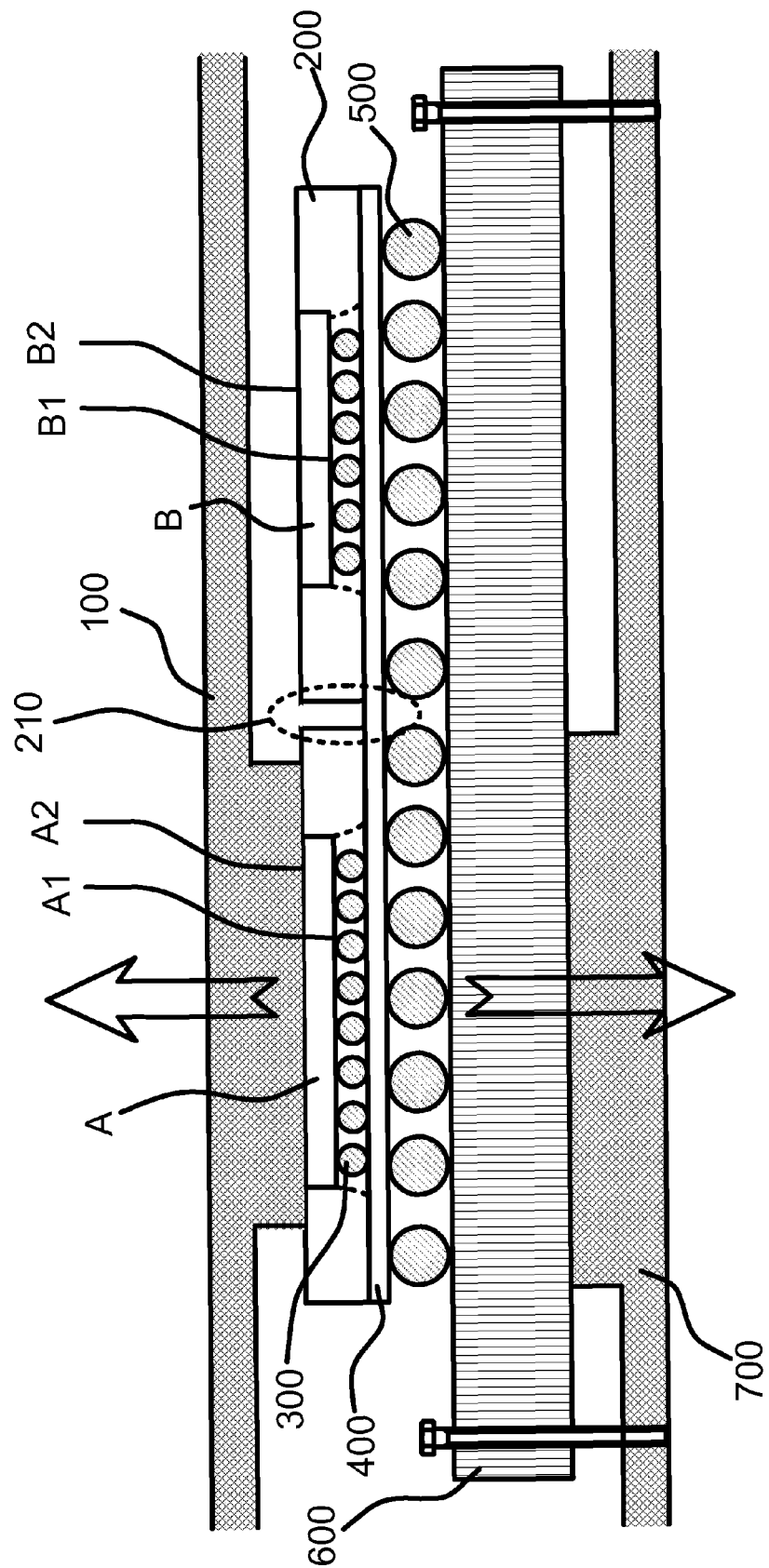
FIG. 6 depicts a assembly structure diagram of a chip thermal dissipation structure employed in an electronic device having more chips according to the fifth embodiment of the present invention.

Please refer to FIG. 6, depicts a assembly structure diagram of a chip thermal dissipation structure employed in an electronic device having more chips A, B according to the fifth embodiment of the present invention. As similarly described in the third embodiment of the present invention, the first Chip A has a first chip face A1 and a first chip back A2. The second Chip B has a second chip face B1 and a second chip back B2. Likewise, the chip thermal dissipation structure according to the fifth embodiment of the present invention comprises a first case 100, chip molding material 200, a plurality of first bumps 300, a plurality of second bumps 302, a packaging substrate 400, a plurality of solders 500, a printed circuit board 600 and a second case 700. The difference of the fifth embodiment of the present invention from the third embodiment is: although the first chip A and the first chip B are both covered by the chip molding material 200, the chip molding material 200 between the first chip A and the first chip B is divided and a slit 210 exists. Certainly, the fourth and fifth embodiments of the present invention can be combined. Then, in the fifth embodiment, the first case 100 can comprise a downward protrusion in position corresponding to the second chip back B2 of the second chip B to contact the second chip back B2 of the second chip B. The second case 700 comprises an upward protrusion in position corresponding to the second Chip B to contact the second surface of the printed circuit board 600.

Figure 7:
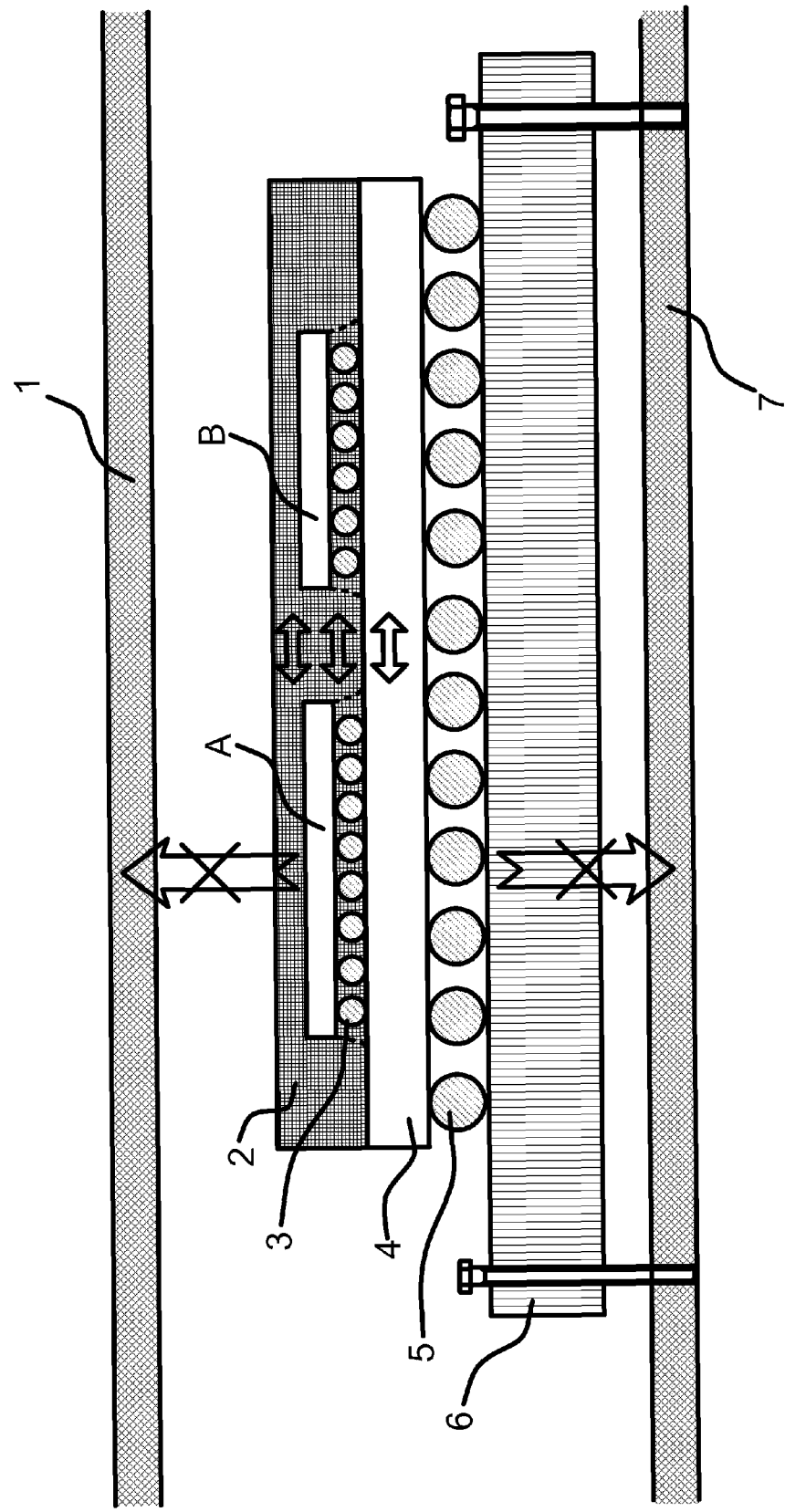
FIG. 7 depicts a structure diagram of an electronic device having more chips according to prior arts.

Please refer to the embodiments shown in FIG. 4 to FIG. 6 and the assembly structure of the electronic device having more chips A, B according to prior arts shown in FIG. 7 with the comparison therewith. Because the thermal conductivity coefficient of the air is very low, it is about 0.0257 (W/mK) when the temperature is 20 degrees Celsius; about 0.0287 (W/mK) when the temperature is 60 degrees Celsius. However, the thermal conductivity coefficient of copper is about 386 (W/mK) when the temperature is 20 degrees Celsius; the thermal conductivity coefficient of aluminum is about 198 (W/mK) when the temperature is 20 degrees Celsius. The thermal conductivity coefficient of epoxy is about 0.19 (W/mK) when the temperature is 20 degrees Celsius. Even the epoxy type materials which have been improved with better thermal conductivities, the thermal conductivity coefficients thereof can merely reach up to 1-10 (W/mK).

The thermal conductivity of the heat flow naturally tends toward the directions of higher thermal conductivity coefficient. As aforementioned, as the heat dissipation design of prior arts is utilized as shown in FIG. 7, when the chip A generates heat, as regarding of the heat flow thermal conductivity of the generated thermal energy, the upward path is stopped at the chip molding material 200. Many elements, such as the underfill material filled among the bumps 3 which has bad thermal conductivity, the dielectric layer material in the packaging substrate 4, the dielectric layer material in the print circuit board 6 and etc. exist in the downward path of the heat flow thermal conductivity, the conductivity of the thermal energy generated by the Chip A is interfered thereby. Because the thermal conductivity coefficient of the air is very low, as shown in FIG. 7, the most of the thermal energy generated by the Chip A is inevitably conducted toward the chip B. Consequently, the structure temperature of the whole electronic device must be raised. The performance is affected. The power consumption is increased. Moreover, the lifetime of the electronic device can be shortened even more.

On the contrary, please refer to the embodiment shown in FIG. 4 of the present invention, the first chip face A1 of the first chip A contacts the upper shell 100. The thickness of each dielectric layer in the package substrate 400 is less than 30 μm. The downward second surface of the packaging substrate 400 contacts the second case 700 in position corresponding to the first chip A. Accordingly, the junction temperature of the first chip A is lower than a junction temperature of the first chip A under circumstance that the first case 100 does not contact the first chip back A2; the junction temperature of the first chip A is lower than a junction temperature of the first chip A under circumstance that the second case 700 does not contact the print circuit board 600 in position corresponding to the first chip A. Therefore, enormous amounts of thermal energy generated by the first chip A can be effectively conducted toward the upper shell 100 and the second case 700. The effect of the thermal energy generated by the first chip A to the second chip B can be significantly reduced.

In the embodiment shown in FIG. 5 of the present invention, similarly, the second chip back B2 of the second chip B contacts the upper shell 100. The thickness of each dielectric layer in the packaging substrate 400 is less than 30 μm. The downward second surface of the packaging substrate 400 contacts the second case 700 in position corresponding to the second chip B. Consequently, the junction temperature of the second chip B is lower than a junction temperature of the second chip B under circumstance that the first case 100 does not contact the second chip back B2; the junction temperature of the second chip B is lower than a junction temperature of the second chip B under circumstance that the second case 700 does not contact the print circuit board 600 in position corresponding to the second chip B. Therefore, enormous amounts of thermal energy generated by the second chip B also can be effectively conducted toward the first case 100 and the second case 700.

Furthermore In the embodiment shown in FIG. 6 of the present invention, the chip molding material 200 between the first chip A and the first chip B is divided and the slit 210 is formed therebetween. The slit 210 makes the chip molding material 200 covering the first chi p A and the chip molding material 200 covering the second chip B separatedly and independently contact with the packaging substrate 400 and connect therewith. More effectively, the effect of the thermal energy generated by the first chip A to the second chip B can be further reduced.

According to the chip thermal dissipation structure of the present invention, the heat resistance between the first chip and the first case and the heat resistance between the first chip and the second case can be significantly reduced. Then, the heat flow paths of thermal energy generated by the first chip are directly oriented toward the upper shell and the second case. The drawback in prior arts that most of the thermal energy generated by the first chip is conducted toward the second chip can be solved. Consequently, the working temperature of the electronic device having one or more chips can be efficiently reduced. The working performance of the electronic device is promoted and the usage lifetime can be extended.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A chip thermal dissipation structure, employed in an electronic device, comprising:
   a first chip located inside the electronic device, having a first chip face and a first chip back;
   a second chip located inside the electronic device, having a second chip face and a second chip back;
   chip molding material, covering a lateral of the first chip and a lateral of the second chip;
   a first outer case of the electronic device separating an external environment outside the electronic device and an inner environment inside the electronic device, the first outer case encompassing an inner space of the electronic device, the first outer case contacting with the external environment at a first side thereof, and the first outer case at a second side opposite to the first side comprising a downward protrusion in position corresponding to the first chip back of the first chip to contact the first chip back and in position corresponding to the second chip back of the second chip to contact the second chip back;
   a packaging substrate, electrically connecting with the first chip face of the first chip and the second chip face of the second chip via a plurality of first bumps and second bumps, respectively;
   a print circuit board, having a first surface and a second surface and electrically connecting with the packaging substrate at the first surface via a plurality of solders; and
   a second outer case of the electronic device, contacting a portion of the second surface of the print circuit board in position corresponding to the first chip and the second chip.

2. The chip thermal dissipation structure according to claim 1, wherein the packaging substrate comprises a plurality of dielectric layers, and a thickness of each dielectric layer is less than 30 μm.

3. The chip thermal dissipation structure according to claim 1, wherein the chip molding material has a slit in between the first chip and second chip.

4. The chip thermal dissipation structure according to claim 1, wherein the first outer case is formed by a metal material.

5. The chip thermal dissipation structure according to claim 1, wherein the second outer case comprises an upward protrusion in position corresponding to the first chip to contact a portion of the second surface of the print circuit board.

6. The chip thermal dissipation structure according to claim 1, wherein the second outer case maintains contact with a portion of the second surface of the print circuit board via a heat-conducting material.

7. The chip thermal dissipation structure according to claim 1, wherein the second outer case is formed by a metal material.

8. The chip thermal dissipation structure according to claim 1, wherein the second outer case comprises an upward protrusion in position corresponding to the second chip to contact a portion of the second surface of the print circuit board.

* * * * *